(12) United States Patent
Ye et al.

(10) Patent No.: US 8,354,347 B2
(45) Date of Patent: Jan. 15, 2013

(54) METHOD OF FORMING HIGH-K DIELECTRIC STOP LAYER FOR CONTACT HOLE OPENING

(75) Inventors: Jianhui Ye, Bristow, VA (US); Huang Liu, Singapore (SG); Alex K H See, Singapore (SG); Wei Lu, Singapore (SG); Chun Hui Low, Singapore (SG); Chim Seng Seet, Singapore (SG); Mei Sheng Zhou, Singapore (SG); Liang Choo Hsia, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 403 days.

(21) Appl. No.: 11/953,881

(22) Filed: Dec. 11, 2007

(65) Prior Publication Data

US 2009/0146296 A1    Jun. 11, 2009

(51) Int. Cl.
*H01L 21/461* (2006.01)

(52) U.S. Cl. ............... 438/735; 257/734; 257/E21.214; 257/E21.02

(58) Field of Classification Search ............ 257/734; 438/735, E21.214, E21.02
See application file for complete search history.

(56) References Cited

U.S. PATENT DOCUMENTS

| | | | |
|---|---|---|---|
| 6,174,777 B1 | 1/2001 | Jang | |
| 6,194,784 B1 * | 2/2001 | Parat et al. | 257/774 |
| 6,399,511 B2 | 6/2002 | Tang et al. | |
| 6,444,566 B1 * | 9/2002 | Tsai et al. | 438/624 |
| 6,455,431 B1 * | 9/2002 | Hsieh et al. | 438/691 |
| 6,835,667 B2 | 12/2004 | Christenson et al. | |
| 6,911,395 B1 | 6/2005 | Qiao et al. | |
| 7,098,515 B1 * | 8/2006 | Gu et al. | 257/397 |
| 2003/0098038 A1 * | 5/2003 | Siegele et al. | 134/1.1 |
| 2005/0111806 A1 * | 5/2005 | Brask et al. | 385/129 |
| 2005/0211375 A1 * | 9/2005 | Knotter et al. | 156/345.1 |
| 2006/0019451 A1 | 1/2006 | Hwang et al. | |
| 2006/0084275 A1 * | 4/2006 | You et al. | 438/704 |
| 2006/0163735 A1 * | 7/2006 | Tseng | 257/758 |
| 2007/0158709 A1 * | 7/2007 | Mouli | 257/291 |
| 2008/0057701 A1 * | 3/2008 | Engbrecht et al. | 438/624 |
| 2008/0277694 A1 * | 11/2008 | Hossain et al. | 257/213 |

OTHER PUBLICATIONS

M. Helot et al., Plasma Etching of HfO2 at Elevated Temperatures in Chlorine-based Chemistry, J. Vac. Sci. Technol., Jan./Feb. 2006, p. 30-40, A 24(1).

* cited by examiner

*Primary Examiner* — Eugene Lee
*Assistant Examiner* — Elias M Ullah
(74) *Attorney, Agent, or Firm* — Horizon IP Pte Ltd (57) ABSTRACT

A composite etch stop layer which comprises primary and secondary stop layers is used to form contacts in a dielectric layer to contact regions in a substrate. The secondary etch stop layer includes a high-k dielectric material to achieve high etch selectivity with the dielectric layer during contact formation. The secondary stop layer is removed to expose the contact regions. Removal of the secondary stop layer is achieved with high selectivity to the materials therebelow.

29 Claims, 8 Drawing Sheets

METHOD OF FORMING HIGH-K DIELECTRIC STOP LAYER FOR CONTACT HOLE OPENING

FIELD OF THE INVENTION

The present invention relates generally to integrated circuits, and more particularly to a method for forming borderless contacts in integrated circuits.

BACKGROUND OF THE INVENTION

The fabrication of integrated circuits (ICs) involves the formation of features on a substrate that make up circuit components, such as transistors, resistors and capacitors. Typically, at least some of these devices are formed on active areas in the substrate. The active areas are electrically isolated from one another by isolation regions formed of, for example, shallow trench isolation (STI). The STI trench is typically filled with silicon oxide. The devices are interconnected, enabling the ICs to perform the desired functions. Interconnections include, for example, contact holes in an interlevel dielectric layer to provide contact to an active area of the substrate. The contact holes can be formed using damascene techniques.

In order to achieve higher packing density, borderless contacts have been introduced. In borderless contact schemes, the contact hole extends to the edge of the active area. In such case, alignment margin between the contact hole and the active area is greatly reduced, increasing the potential for, for example, contact to gate short. The problem is exacerbated by the continued shrinkage of feature sizes in ICs. Furthermore, as devices are scaled down to 65 nm technology node and beyond, the process window for contact etching shrinks considerably. For example, the amount of polymer deposition during etching must be carefully controlled to avoid, on the one hand, contact open due to excessive polymer deposition inside the contact hole and, on the other hand, oxide gauging in the STI area due to poor etch selectivity.

From the foregoing discussion, it is desirable to provide an improved method for forming borderless contacts in ICs.

SUMMARY OF THE INVENTION

The present invention relates to ICs. In one aspect of the invention, a method for forming interconnections in an IC is disclosed. The method comprises providing a substrate having circuit components with contact regions. A composite etch stop layer is formed over the substrate to cover the circuit components and the substrate. The composite etch stop layer comprises primary and secondary stop layers where the secondary stop layer is disposed beneath the primary stop layer and over the circuit components. An ILD layer is formed over the composite etch stop layer. The ILD layer is patterned with high selectivity to the secondary stop layer to form contact vias therein to the contact regions. The secondary layer is removed to expose the contact regions and the removal is achieved with high selectivity to materials below.

In another aspect of the invention, it relates to an IC. The IC comprises a substrate with a contact region. An etch stop layer includes a high-k dielectric material over the substrate covering the contact region. A dielectric layer is over the etch stop layer. A contact opening in the dielectric layer and etch stop layer, wherein the etch stop layer serves as an etch stop for forming the contact opening.

A method for forming interconnections in an IC is provided in another aspect of the invention. The method comprises providing a substrate having circuit components with contact regions. An etch stop layer comprising a high-k dielectric material is formed over the substrate, covering the circuit components and the substrate. An ILD layer is formed over the etch stop layer and the ILD layer is patterned to form contact vias therein to the contact regions. The ILD layer can be patterned with high selectivity to the etch stop layer. The etch stop layer is removed with high selectivity to materials below to expose the contact regions.

In yet another aspect of the invention, a method of fabricating an IC is disclosed. The method includes providing a substrate having a silicided semiconductor structure. A high-k dielectric film is deposited on the substrate to cover the structure. A silicon nitride (SiN) etch stop layer is formed over the high-k dielectric film. A dielectric layer is formed over the SiN layer. A mask layer is formed and pattered over the dielectric layer to form a pattern mask layer. Portions of the dielectric layer which are exposed by the patterned mask layer to the high-k dielectric film are selectively removed. Exposed portions of the high-k dielectric film are removed to form contact opening and a contact structure is formed in the contact opening.

These and other objects, along with advantages and features of the present invention herein disclosed, will become apparent through reference to the following description and the accompany drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION OF THE INVENTION

Figure 1:
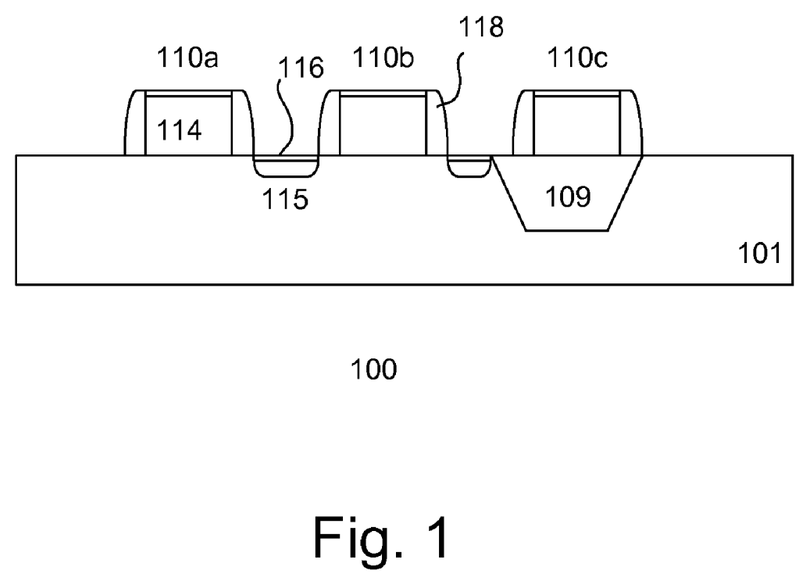
FIGS. 1-8 show a process for forming an interconnection in accordance with one embodiment of the invention.

The present invention relates to ICs. More particularly, the present invention relates to contacts or interconnections in ICs. FIGS. 1-8 show a process for forming an integrated circuit (IC) in accordance with one embodiment of the invention. The ICs can be any type of IC, for example dynamic or static random access memories, signal processors, or system on chip devices. Referring to FIG. 1, a portion of a substrate 101 of an IC 100 is shown. The substrate 101, in this example, is a semiconductor substrate. Typically, the semiconductor substrate comprises a lightly doped p-type silicon substrate. Other types of substrates, such as a germanium-based, gallium arsenide, silicon-on-insulator (SOI), or sapphire substrate, are also useful.

The substrate is prepared with circuit components with contact regions. Generally, the substrate includes numerous circuit components and contact regions. The substrate, as shown, is prepared with transistors 110*a-c*. A transistor includes a gate 114 with source/drain diffusion regions 115. Adjacent transistors can be arranged to share a common diffusion region. The gate can be formed as gate conductors, serving, for example, as word lines. Forming individual gates is also useful. Dielectric spacers 118 can be provided on the gate sidewalls. The gate and source/drain diffusion regions serve as electrodes for the transistors. Silicide contacts 116 can be provided on the electrodes to lower contact resistance. To isolate devices, isolation regions 109 comprising, for example, silicon oxide can be provided. Preferably, the isolation regions comprise shallow trench isolations (STIs). Other types of isolation regions or materials can also be useful. Transistor 110c can be formed on the isolation regions. It is understood that transistors are shown for illustrative purposes and that the substrate can also be prepared with other types or arrangements of circuit components.

Figure 2:
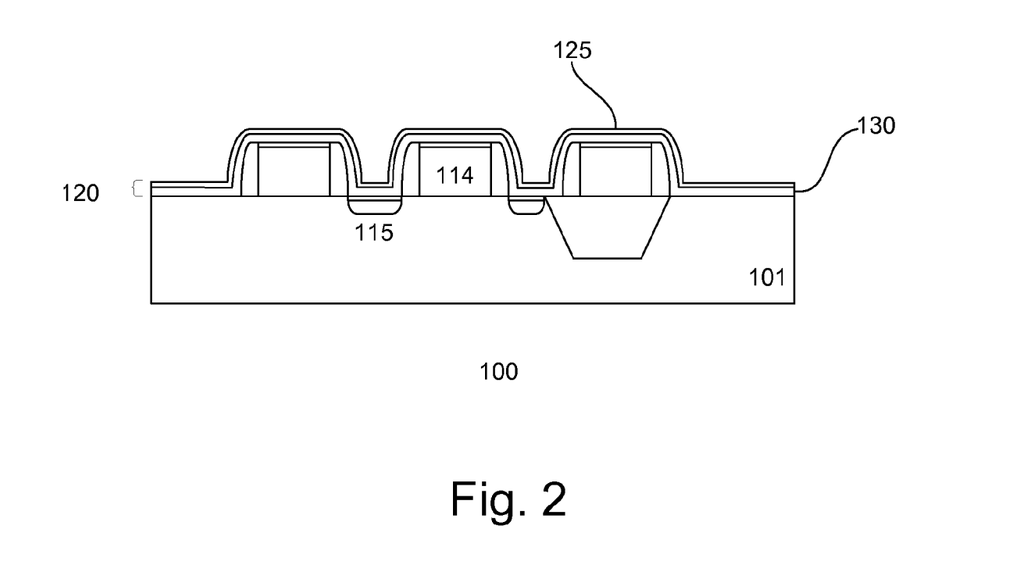

The process of forming the IC continues in FIG. 2. In accordance with the invention, an etch stop layer 120 is formed over the substrate. The etch stop layer covers the circuit components and substrate. The etch stop layer serves as an etch stop in the process of forming contact holes or vias for interconnects. In one embodiment, the etch stop layer comprises a composite etch stop layer. The composite etch stop layer comprises at least a primary (first) stop layer 125 and a secondary (second) stop layer 130.

In one embodiment, the primary stop layer comprises a conventional contact hole etch stop material. The material of the primary stop layer is selected such that an interlevel dielectric (ILD) layer formed subsequently over the etch stop layer can be etched selectively thereto. The primary stop layer, for example, comprises silicon nitride while the ILD layer comprises silicon oxide. Typically, the thickness of the first stop layer is about 300 Å.

The secondary stop layer is disposed below the primary stop layer. In one embodiment, the secondary stop layer comprises a material that can be etched relative to silicide and TEOS with high etch selectivity, for example, between about 10 and 100. In one embodiment, the secondary etch stop layer comprises a high k dielectric material. In one embodiment, the secondary stop layer comprises hafnium or zirconium containing dielectric compounds. Such compounds include, for example, hafnium oxide ($HfO_2$), $Hf_xO_y$, hafnium silicate compounds like $Hf_xSi_yO_z$ and $Hf_xSi_yO_zN$ silicate, zirconium oxide ($ZrO_2$), $Zr_xO_y$, zirconium silicate compound like $Zr_xSi_yO_z$, aluminium oxide ($Al_2O_3$), aluminium silicate compound like $Al_xSi_yO_z$, titanium oxide ($TiO_2$), $Ti_xO_y$, titanium silicate compound like $Ti_xSi_yO_z$, and materials comprise both Si and N elements such as $Si_xO_yN_z$ and a combination thereof. Other high-k dielectric materials which are resistant to the attack of fluorine-type gases may also be useful. In one embodiment, the secondary stop layer comprises $HfO_2$. The thickness of the secondary stop layer is, for example, about 10-1000 Å thick. Other thicknesses may also be useful.

In an alternative embodiment, the etch stop layer comprises a high k dielectric material. In one embodiment, the etch stop layer comprises hafnium or zirconium containing dielectric compounds. Such compounds include, for example, hafnium oxide ($HfO_2$), $Hf_xO_y$, hafnium silicate compounds like $Hf_xSi_yO_z$ and $Hf_xSi_yO_zN$ silicate, zirconium oxide ($ZrO_2$), $Zr_xO_y$, zirconium silicate compound like $Zr_xSi_yO_z$, aluminium oxide ($Al_2O_3$), aluminium silicate compound like $Al_xSi_yO_z$, titanium oxide ($TiO_2$), $Ti_xO_y$, titanium silicate compound like $Ti_xSi_yO_z$, and materials comprise both Si and N elements such as $Si_xO_yN_z$ and a combination thereof. Other high-k dielectric materials which are resistant to the attack of fluorine-type gases may also be useful. In one embodiment, the secondary stop layer comprises $HfO_2$.

Conventional processes can be employed to form the composite etch stop layer. For example, the secondary stop layer is deposited over the substrate, covering the circuit components and substrate. The primary stop layer is then deposited on the substrate over the secondary stop layer. The layers can be deposited by, for example, chemical vapor deposition (CVD), physical vapor deposition (PVD), sputtering, thermal oxidation, and the like.

Figure 3:
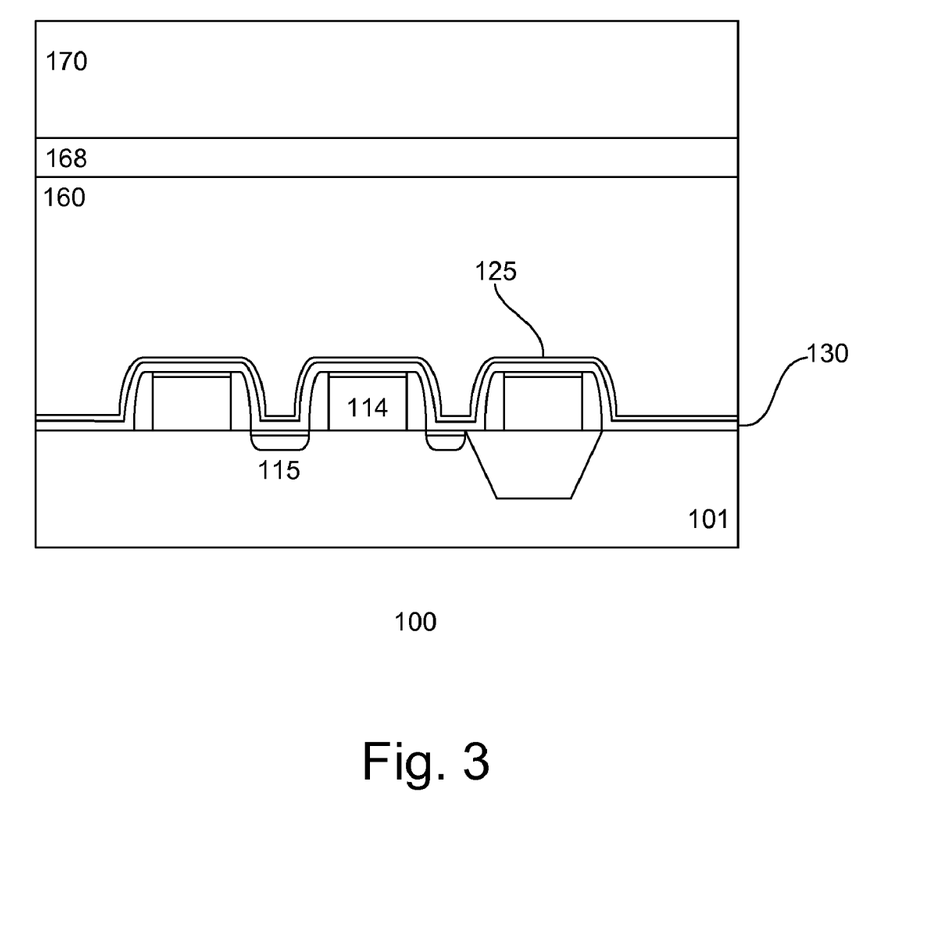

In FIG. 3, an interlevel dielectric (ILD) layer 160 is formed, covering the composite etch stop layer. In one embodiment, the ILD layer comprises a dielectric material, such as silicon dioxide. Other types of dielectric materials including doped silicon oxide such as fluorinated silicon oxide (FSG), undoped or doped silicate glasses such as boron phosphate silicate glass (BPSG) and phosphate silicate glass (PSG), spin-on glass (SOG), undoped or doped thermally grown silicon oxide, undoped or doped TEOS deposited silicon oxide, and other low-k or ultra low-k dielectric materials can also be used to form the ILD layer. Forming more than one ILD layer is also useful. The thickness of the ILD layer should be equal to about the height of the damascene contact structure. In one embodiment, the ILD layer is about 2000-20,000 Å thick. Preferably, the thickness of the ILD layer is in the range of about 3000-8000 Å. Other thicknesses are also useful, for example, depending on the desired height of the contact hole and interconnecting lines.

The ILD layer can be deposited using various types of CVD processes such as plasma enhanced (PECVD), high density (HDCVD), atmospheric pressure (APCVD) as well as spin-on processes, depending on the type of material used and application. In a preferred embodiment, ILD layer such as silicon dioxide is grown by PECVD using tetraethylorthosilicate (TEOS) as the main precursor gas. A chemical mechanical polish (CMP) or etch back process can be performed, if necessary, to provide planar top surfaces.

A soft mask layer 170 is formed over the ILD layer. In one embodiment, the soft mask layer comprises photoresist. A bottom antireflective coating (BARC) 168 can be formed above the ILD stack to reduce substrate reflectivity. The BARC can comprise an organic or inorganic material and be formed by appropriate techniques, such as spin-on, sputtering or CVD. Other techniques may also be useful. In one embodiment, the BARC comprises an organic material formed by a spin-on process. Alternatively, the BARC can comprise inorganic material formed by, for example, CVD or PVD techniques.

Figure 4:
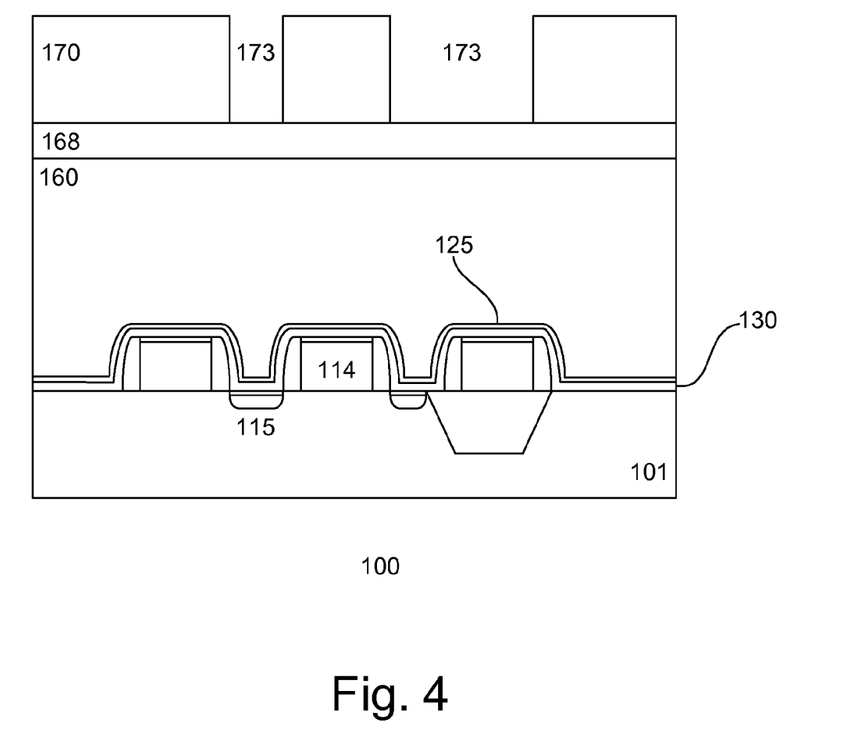

In FIG. 4, the soft mask is patterned to form openings 173 corresponding to contact regions. Conventional lithographic and patterning processes can be employed to pattern the soft mask. For example, the photoresist is exposed to an exposure source with the desired pattern and developed to remove desired portions to form the openings. Portions of the BARC exposed by patterning the soft mask are also removed. Depending on the type of BARC used, the exposed portions can be removed in the resist development process or separately.

Figure 5:
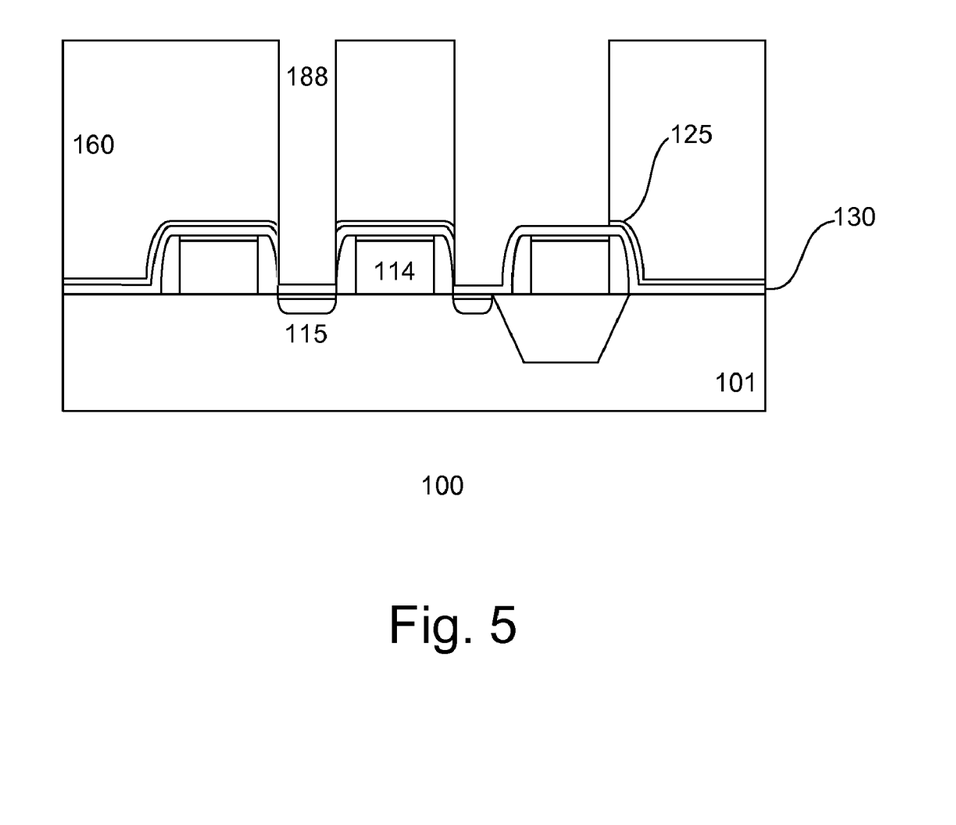

Referring to FIG. 5, the ILD layer is patterned using the photoresist as the etch mask to form contact holes 188. Generally, the BARC and ILD layers are patterned with separate etch processes. The etch processes, for example, can be performed in the same equipment (in-situ) using different chemistries. The BARC and ILD layers can be patterned using an anisotropic etch, such as reactive ion etch (RIE) or dry etch.

In accordance with one embodiment of the invention, the etch for patterning the ILD layer employs an etch chemistry which etches the ILD material with high selectivity to the secondary stop layer. In one embodiment, the etch selectivity is between 10 and 100. Preferably, the etch employs a lean chemistry. Use of a lean chemistry advantageously avoids polymer buildup in the via. Polymer buildup acts as an etch mask, preventing etching of the ILD material, which can cause opens or increase contact resistance. In one embodiment, the ILD layer is patterned using a fluorocarbon chemistry (e.g., $C_4F_6$). The process, for example, is performed at a pressure of about 30 to 200 mT and a temperature of less than about 200° C. Other etch chemistries or parameters to produce high etch selectivity between the ILD and secondary stop layers and/or reduce polymer buildup are also useful. Due to the high etch selectivity between the ILD and secondary stop layer, the etch essentially stops at the secondary stop layer.

Figure 6:
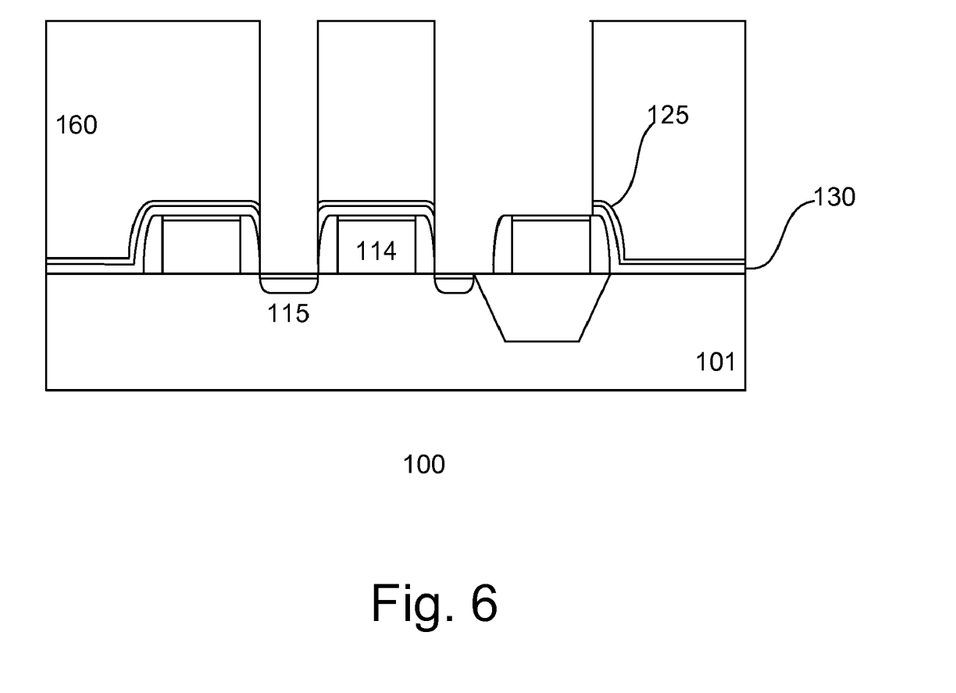

Referring to FIG. 6, the exposed portions of the secondary stop layer is removed to expose the contact regions below. In one embodiment, the etch to remove the secondary stop layer is highly selective to the silicide contact and oxide (e.g., spacers and STIs) below. The etch selectivity, in one embodiment, is between 10 and 50. In one embodiment, the stop layer is removed by wet clean using hydrofluoric acid (HF) in a dilute aqueous solution. Etching of high-k dielectric materials using HF solutions is described in U.S. Pat. No. 6,835,667, which is incorporated herein by reference for all purposes. Preferably, the HF solution is sufficiently dilute to selectively etch the stop layer with minimum damage to the underlying STI oxide. The dilute HF, in one embodiment, comprises about 0.0001 to 0.01 weight % (wt %) of HF. Preferably, about 0.0049 wt % of HF is used. Other concentrations may also be useful. Etch selectivity to oxide is about 50. Preferably, wet clean is carried out at an elevated temperature to further increase etch selectivity to oxide. Etch selectivity can also be increased by reducing the pH of the wet cleaning solution, for example, by adding an acid. In one embodiment, wet clean is carried out at about 4 to 95° C. and pH in the range of about 0.01 to 5. Preferably, wet clean is carried out at about 80° C. and a pH of about 0.1. In such case, high etch selectivity of about 10-50, depending on the high-k dielectric material used, can be obtained such that effectively no STI oxide is lost from removal of the stop layer. The etch selectivity of various high-k dielectric materials as a function of HF concentration and temperature is shown in Table 1 below. Table 1 is taken from U.S. Pat. No. 6,835,667.

TABLE 1

Etch Selectivity of Various High-k Dielectric Layer as a Function of HF Concentration and Temperature

| HF (wt %) | Temperature (° C.) | $Zr_xSi_yO_x$ | $Hf_zSi_yO_x$ (40%) | $Hf_zSi_yO_x$ (60%) | $Hf_zSi_yO_x$ (80%) | TEOS |
|---|---|---|---|---|---|---|
| 0.49 | 20 | 0.5 | | 1.5 | 0.86 | 1.00 |
| 0.049 | 20 | 0.6 | | 1.0 | 0.38 | 1.00 |
| 0.49 | 80 | 0.3 | | 0.5 | 0.38 | 1.00 |
| 0.049 | 80 | 6 | 12 | 2.4 | 0.94 | 1.00 |
| 0.016 | 80 | 8.8 | | 5.7 | 1.5 | 1.00 |
| 0.0049 | 80 | 90 | 50 | 22 | 10 | 1.00 |

Alternatively, the stop layer is removed using dry etching. In one embodiment, dry etch based on bromine chemistry is used. The use of dry etch using bromine gas plasma is described in, for example, U.S. Patent Application Publication No. 2006/0019451, which is incorporated herein by reference for all purposes. As described, the substrate is preheated to a temperature of about 200° C. or greater before a gas plasma comprising $Br_2$, HBr, or a mixture thereof, is used to etch the dielectric layer in a plasma etcher. In another embodiment, chlorine-based chemistry is used. Plasma etching of $HfO_2$ using chlorine-based chemistry is described in *J. Vac. Sci. Technology*, A 24(1) (January/February, 2006), pp. 30-40, which is incorporated herein by reference for all purposes. As described, $HfO_2$ is etched using chlorocarbon gas chemistries, such as $CCl_4$ or $Cl_2$—CO, in an inductively coupled plasma (ICP) reactor at high temperatures of about 218-330° C. During etching, a chlorine-rich carbon layer is formed on top of the STI oxide surface, improving etch selectivity.

$HfO_2$, in accordance with one embodiment of the invention, is removed using chlorine-based gases such as $CCl_4$, $Cl_2$/CO or $CCl_4$/Ar/$O_2$, with a low pressure range of 1 to 200 mT and a slightly elevated temperature range of about 5 and 500° C. Preferably, the dry etch is conducted at a pressure of about 5 mT and a temperature of about 250° C. In such case, high etch selectivity of about 10-20 is achieved, depending on the types of high-k dielectric materials being used.

Figure 7:
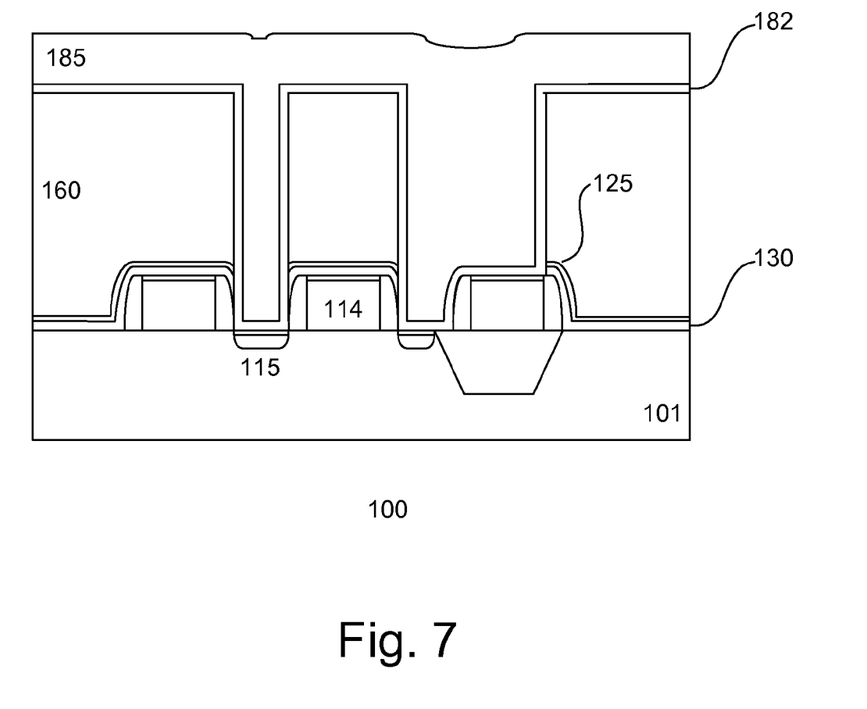
Figure 8:
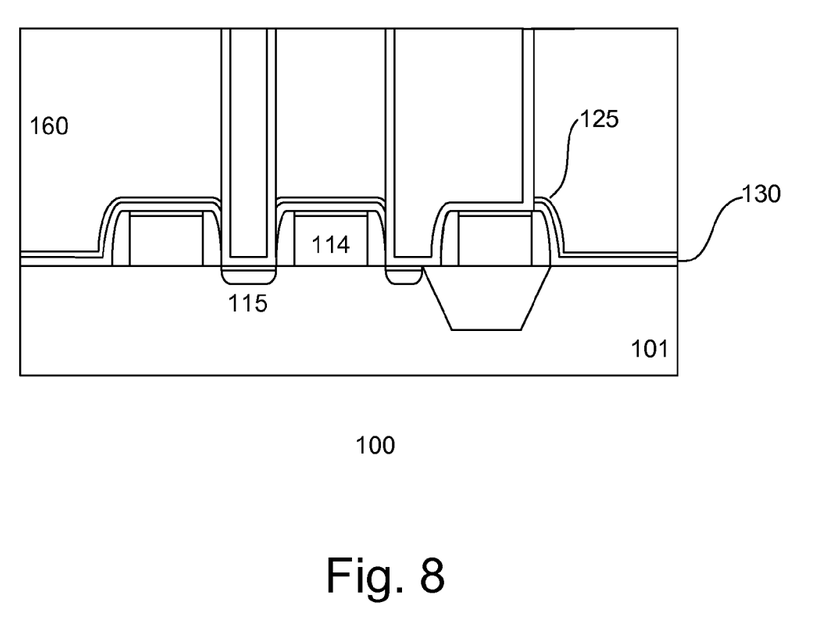

Referring to FIG. 7, the process continues by forming the interconnect. In one embodiment, the process continues by filling the vias with a conductive material. In one embodiment, the via are filled with tungsten (W). Other types of conductive materials, such as copper and aluminum, are also useful. For W applications, a conductive barrier 182 layer is deposited over the substrate, covering the ILD layer and lining the inner surfaces of the damascene structure. The conductive barrier layer provides a diffusion barrier for the conductive material and/or improves adhesion of the conductive material to the underlying layers. The conductive barrier, for example, comprises titanium, tantalum, nitrides thereof, or combination thereof. Other barrier materials such as nitrides of transitional metal are also useful. In one embodiment, the conductive barrier comprises titanium and titanium nitride layers. The conductive barrier layer is formed by, for example, CVD or PVD. After the conductive barrier is formed, the conductive W layer 185 is deposited on the substrate by, for example, CVD or PVD. The W layer fills the damascene structure, with excess material covering the substrate surface. In FIG. 8, the substrate is polished by CMP to remove excess material on the surface, completing the formation of the contacts.

The process continues to complete fabricating the IC. For example, the process continues to form interconnects, additional interconnect levels, passivation layer, dicing, assembly and packaging. In alternative embodiments, interconnects and contact can be formed using dual damascene techniques. With the use of a composite etch stop layer according to the invention, polymerization in the contact opening can be avoided. Additionally, the contacts can be formed with minimal erosion of silicide contact and isolation material, increasing process window and yields.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming interconnections in an integrated circuit (IC) comprising:
   providing a substrate with
      a trench isolation region comprising an isolation material, the trench isolation region having a planar top surface, and
      a circuit region having a circuit component with a contact region, wherein the contact region is on a surface of the substrate;

forming an etch stop stack over the substrate, covering the circuit component and the substrate, the etch stop stack comprises primary and secondary etch stop layers, the secondary etch stop layer includes a bottom surface which contacts the contact region on the surface of the substrate and the planar top surface of the trench isolation region and the primary etch stop layer is disposed above a top surface of the secondary etch stop layer, wherein the secondary etch stop layer, which is below the primary etch stop layer, comprises a high k material which is different from the isolation material of the trench isolation region;

forming an interlayer dielectric (ILD) layer over the etch stop stack; and patterning the ILD layer to form a contact via therein to the contact region, wherein the patterning the ILD layer comprises performing a first anisotropic etch comprising a first etch chemistry, wherein the first anisotropic etch etches the ILD and primary etch stop layers above the secondary etch stop layer by the first anisotropic etch and stops at about the top surface of the secondary etch stop layer, and performing a second etch comprising a second etch chemistry after performing the first anisotropic etch to remove exposed portion of the secondary etch stop layer to expose the contact region, wherein removing the exposed portion of the secondary etch stop layer can be achieved with high selectivity to materials, including the isolation material of the trench isolation region, disposed below the secondary etch stop layer.

2. The method of claim 1 wherein the primary etch stop layer comprises silicon nitride.

3. The method of claim 1 wherein the ILD layer comprises silicon oxide.

4. The method of claim 1 wherein the high k material comprises metal oxide.

5. The method of claim 4 wherein the metal oxide comprises $Hf_xO_y$, $Zr_xO_y$, $T_xO_y$, $Al_xO_y$, $Hf_xSi_yO_z$, $Zr_xSi_yO_z$, $Ti_xSi_yO_z$, or $Al_xSi_yO_z$ or a combination thereof.

6. The method of claim 1 wherein the etch selectivity of the secondary etch stop layer to the ILD layer is about 10 to 100.

7. The method of claim 6 wherein the step of patterning the ILD layer comprises a dry etch using fluorocarbon gases.

8. The method of claim 7 wherein the dry etch is carried out at a pressure of about 30 to 200 mT and a temperature less than about 200° C.

9. The method of claim 1 wherein the etch selectivity of the secondary etch stop layer to the materials disposed below the secondary etch stop layer is about 10 to 50.

10. The method of claim 9 wherein the step of removing the secondary etch stop layer comprises a wet clean using HF in a dilute aqueous solution.

11. The method of claim 10 wherein the dilute HF aqueous solution comprises about 0.0001 to 0.01 wt % of HF.

12. The method of claim 10 wherein the dilute HF aqueous solution comprises about 0.0049 wt % of HF.

13. The method of claim 1 wherein the step of removing the secondary etch stop layer comprises a wet clean with a pH adjustor.

14. The method of claim 13 wherein the wet clean is carried out at temperature of about 4 to 95° C. and pH of about 0.01 to 5.

15. The method of claim 13 wherein the wet clean is carried out at temperature of about 80° C. and pH of about 0.1.

16. The method of claim 1 wherein the step of removing the secondary etch stop layer comprises a dry etch using chlorine based gases at low pressure and high temperature.

17. The method of claim 16 wherein the chlorine based gases comprise a gas selected from the group consisting of $CCl_4$, $Cl_2/CO$ and $CCl_4/Ar/O_2$.

18. The method of claim 16 wherein the dry etch is carried out at a pressure of about 1 to 200 mT and a temperature of about 5 to 500° C.

19. The method of claim 16 wherein the dry etch is carried out at a pressure of about 5 mT and a temperature of about 250° C.

20. The method of claim 1 wherein the circuit component comprises a transistor and the contact region is a contact region of the transistor.

21. The method of claim 1 wherein the circuit component comprises a transistor and the contact region is a silicide contact region of the transistor.

22. The method of claim 1 wherein a bottom of the contact via does not extend beyond the surface of the substrate.

23. A method for forming a device comprising:
providing a substrate having
trench isolation regions comprising an isolation material, the trench isolation regions include planar top surfaces, and
circuit components with contact regions, wherein the contact regions are on a surface of the substrate;

forming a second etch stop layer having a top and a bottom surface, wherein the bottom surface contacts the contact regions on the surface of the substrate and the planar top surfaces of the trench isolation regions, wherein the second etch stop layer comprises a high k material which is different from the isolation material;

forming a first etch stop layer above the top surface of the second etch stop layer;

forming an interlayer dielectric (ILD) layer over the first etch stop layer; and patterning the ILD layer to form contact vias therein to the contact regions, wherein the patterning the ILD layer comprises performing a first anisotropic etch comprising a first etch chemistry, wherein the first anisotropic etch etches the ILD and first etch stop layers with high selectively to the second etch stop layer by the first anisotropic etch and stops at about the top surface of the second etch stop layer, and performing a second etch comprising a second etch chemistry after performing the first anisotropic etch to remove exposed portions of the second etch stop layer to expose the contact regions, wherein removing the exposed portions of the second etch stop layer can be achieved with high selectivity to materials, including the isolation material of the trench isolation regions, disposed below the second etch stop layer.

24. A method for forming a device comprising:
providing a substrate having
a trench isolation region with an isolation material, the trench isolation region includes a planar top surface, and
a circuit component with a contact region, wherein the contact region is on a surface of the substrate, wherein the substrate is prepared with
a second etch stop layer thereon, a bottom surface of the second etch stop layer contacts the contact region on the surface of the substrate and the planar top surface of the isolation region, the second etch stop layer having a different material than the isolation material, a first etch stop layer on the substrate over a top surface of the second etch stop layer, and an interlayer dielectric (ILD) layer on the substrate over the first etch stop layer; and patterning the ILD layer to form a contact via therein to the contact region, wherein the patterning the ILD layer comprises performing a first anisotropic etch comprising a first etch chemistry to form a via opening corresponding to the contact region, wherein the first anisotropic etch removes the ILD and first etch stop layers by the first anisotropic etch and stops at about the top surface of the second etch stop layer; and performing a second etch comprising a second etch chemistry after performing the first anisotropic etch to remove the second etch stop layer to expose the contact region without eroding the isolation material of the trench isolation region.

25. The method of claim 24 wherein the second etch is an isotropic etch.

26. The method of claim 24 wherein the second etch comprises an anisotropic etch.

27. The method of claim 24 wherein the second etch stop layer comprises a high k dielectric etch stop layer.

28. The method of claim 27 wherein the high k dielectric layer comprises a high k metal oxide.

29. A method for forming a device comprising:
providing a substrate prepared with
a trench isolation region having an isolation material and a planar top surface, and
a contact region,
an etch stop stack having a first etch stop layer and a second high k etch stop layer different from the isolation material, the second high k etch stop layer having a bottom surface in contact with the contact region and the planar top surface of the trench isolation region and the first etch stop layer is disposed over a top surface of the second high k etch stop layer, and
an interlevel dielectric layer (ILD) over the etch stop stack;
forming a contact via opening to the contact region, wherein forming the contact via opening comprising
etching to remove the ILD and the first etch stop layer by a first anisotropic etch to expose the top surface of the second high k etch stop layer in the via opening; and
etching to remove an exposed portion of the second high k etch stop layer in the via opening by a second etch after the etching to remove the ILD and the first etch stop layer by the first anisotropic etch to expose the contact region without eroding the isolation material of the trench isolation region.

* * * * *